United States Patent [19]
Chao et al.

[11] Patent Number: 5,790,417
[45] Date of Patent: Aug. 4, 1998

[54] METHOD OF AUTOMATIC DUMMY LAYOUT GENERATION

[75] Inventors: Ying-Chen Chao; Chia-Hsiang Chen; Jhy-Sheng Sheu, all of Hsin-Chu, Taiwan

[73] Assignee: Taiwan Semiconductor Manufacturing Company Ltd., Hsin-Chu, Taiwan

[21] Appl. No.: 718,735

[22] Filed: Sep. 25, 1996

[51] Int. Cl.$^6$ .......................... G06F 17/50; H01L 23/528
[52] U.S. Cl. .......................... 364/491; 364/489; 364/490; 250/492.22
[58] Field of Search .......................... 364/489, 490, 364/491; 437/51

[56] References Cited

U.S. PATENT DOCUMENTS

| | | | |
|---|---|---|---|
| 5,027,188 | 6/1991 | Owada et al. | 357/68 |
| 5,032,890 | 7/1991 | Ushiku et al. | 357/41 |
| 5,066,997 | 11/1991 | Sakurai et al. | 357/45 |
| 5,341,310 | 8/1994 | Gould et al. | 364/491 |
| 5,441,915 | 8/1995 | Lee . | |
| 5,459,093 | 10/1995 | Kuroda et al. | 437/51 |
| 5,622,899 | 4/1997 | Chao et al. | 438/9 |

*Primary Examiner*—Kevin J. Teska
*Assistant Examiner*—Thuan Do
*Attorney, Agent, or Firm*—George O. Saile; Stephen B. Ackerman; Graham S. Jones, II

[57] ABSTRACT

A method is provided for producing a dummy pattern for an I.C. semiconductor device multi-layer interconnection metallurgy, having a planar global top surface with a dummy pattern for a circuit for use with conductor lines in the circuit pattern. Create a reverse pattern which is a complement of a widened conductor lines in the circuit pattern with openings about the location of the circuit pattern and provide a dummy cross grid pattern. A gridded dummy pattern is generated by creating a dummy grid pattern of the reverse pattern combining it with the negative of the dummy cross grid pattern leaving a cross grid of dummy elements and openings about the location of the circuit pattern. Provide a revised pattern by adding the circuit pattern to the gridded dummy pattern. Take the product of a contact layout pattern multiplied times the sizing operator multiplied times a separation parameter. Then subtract the sized and separated contact layout pattern from the gridded dummy pattern. Then multiply the dummy pattern times a function of sizing operators, and provide a revised contact and circuit pattern by adding the circuit pattern to the sized dummy pattern.

19 Claims, 9 Drawing Sheets

$\overline{A} = \overline{A0+\alpha}$ $G3 = G2 \otimes (-\lambda) \otimes (\lambda)$ $A' = A + G3$ $Co' = Co \ominus \phi$ $G3' = G2 - Co'$ $G4 = G3' \odot (-\lambda) \odot (\lambda)$ $A'' = A + G4$

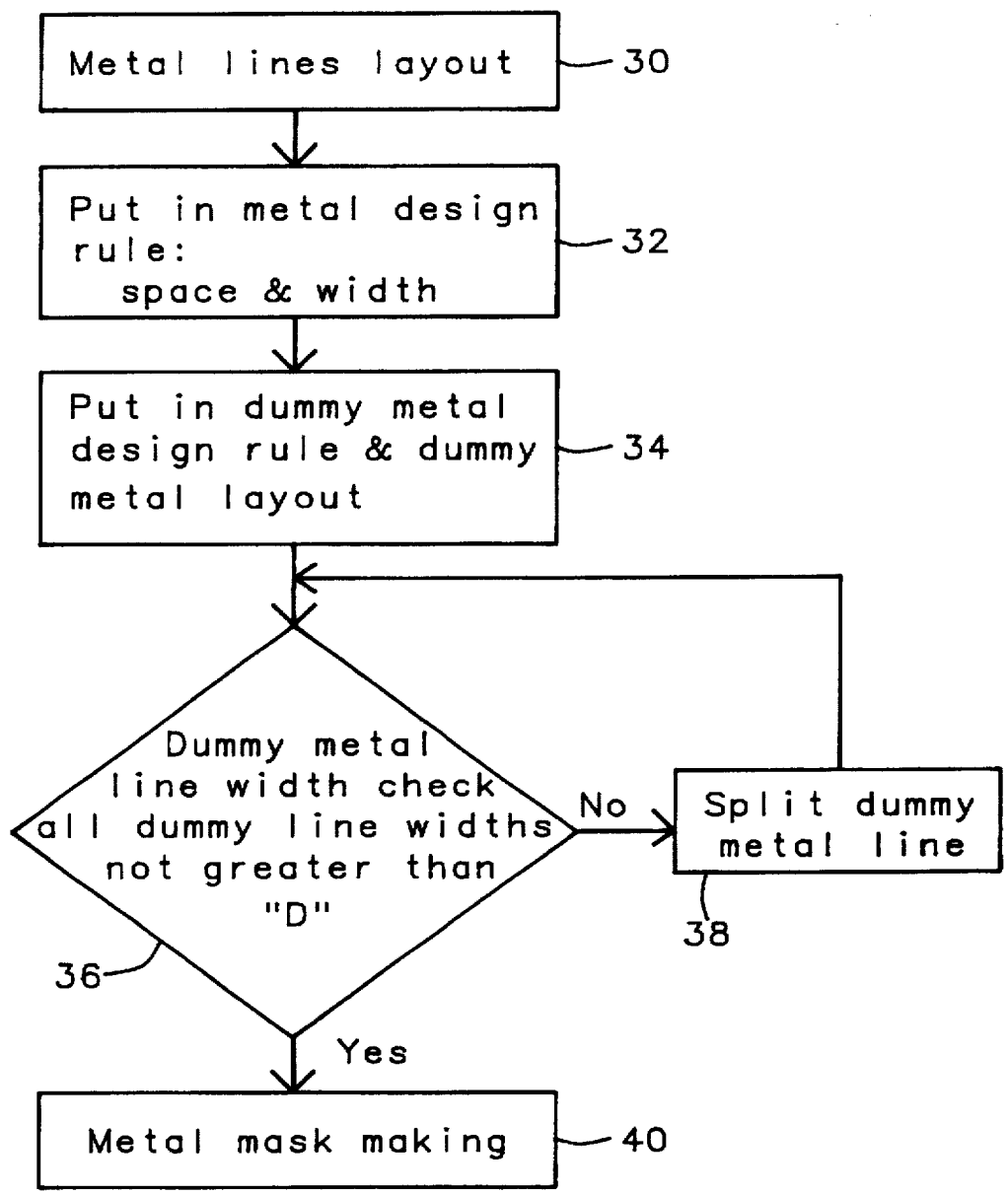
FIG. 14 - Prior Art

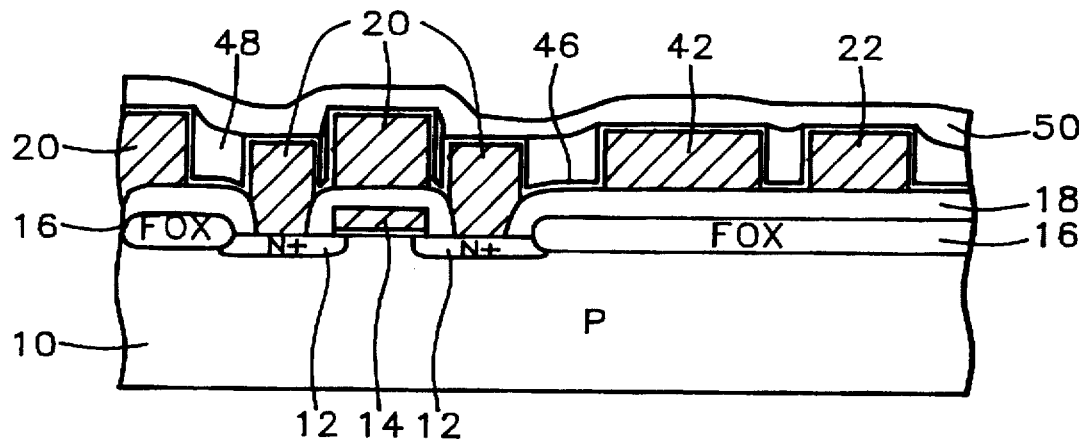
FIG. 15 – Prior Art
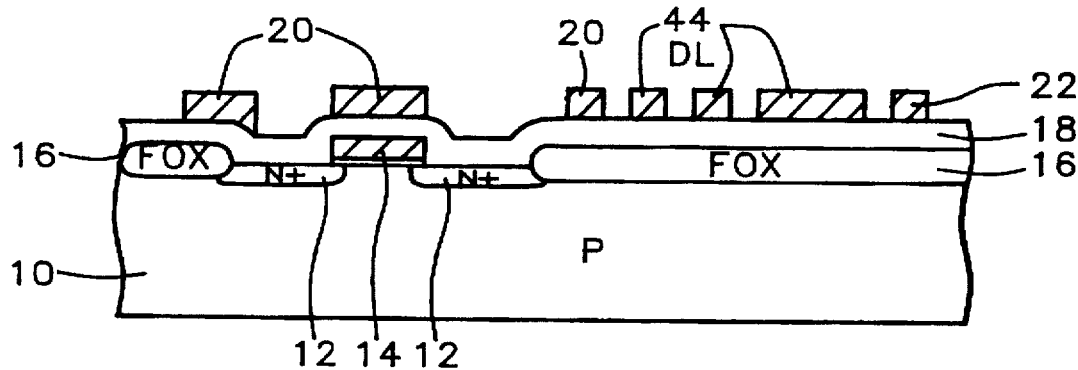
FIG. 16 – Prior Art
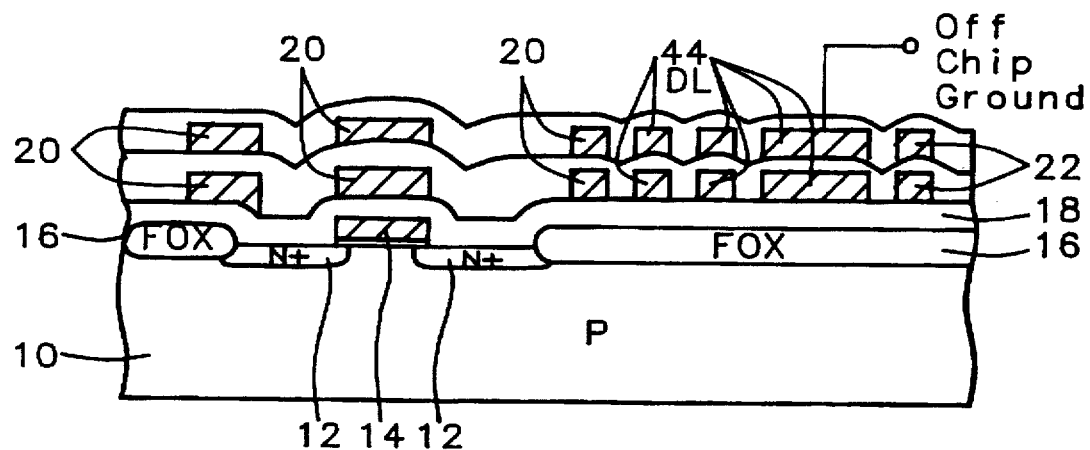
FIG. 17 – Prior Art

METHOD OF AUTOMATIC DUMMY LAYOUT GENERATION

BACKGROUND OF THE INVENTION

1. Field of the Invention

This invention relates to a method of fabricating a multilevel planarized interconnection metallurgy system for integrated circuit semiconductor devices, and more particularly to generation of dummy layouts for such devices.

2. Description of Related Art

The feature size in the state of the art of very large scale integrated circuits (VLSIs) such as high density memory chips, microprocessors and the like, is continuously shrinking lower in the submicron level.

As the conductor lines of the interconnection metallurgy systems have decreased, it is important to maintain as great a degree of surface planarity as possible. Surface planarity is critical in order as follows:

(1) to accommodate the very shallow depths of fields of optical apparatus used for exposing the resist layers necessary to produce the metallurgy patterns, (2) to maintain a uniform metallurgy stripe thickness and (3) to avoid metal stringers.

After a metallurgy stripe pattern is formed on the planar surface of a substrate, it is covered by a dielectric layer. When the dielectric layer is conformal in nature, the resulting surface of the dielectric layer is non-planar, i.e. the surface of the dielectric layer dips down between the metal stripes resulting in the problem that the surface is non-planar in the sense that it has different levels. When a plurality of layers of metallurgy are deposited, and each layer of metallurgy is covered with a dielectric layer, each successive layer contributes to the non-planarity, since there may be areas where a plurality of metal stripes are aligned or overlapped, and other areas where there may be less overlapped stripes, or none.

Progress has been made in depositing the dielectric layer, so that the areas between the stripes are filled while maintaining a greater degree of planarity. Formation of a dielectric layer has the capability to fill submicron gaps completely and to planarize locally. These deposition techniques may be followed by an etch back to further promote planarity. However, while the above techniques fill submicron gaps between closely spaced metal conductor lines, they are generally incapable of filling gaps between conductor lines spaced farther apart.

Commonly assigned U.S. Pat. No. 5,441,915 of Lee for "Process of Fabrication Planarized Metallurgy Structure for a Semiconductor Device" describes the problem of planarity caused by non-uniformly spaced metal stripes in more detail with respect to a semiconductor substrate having a FET device including source/drain regions, and a gate electrode. The substrate also has a field oxide layer, and a relatively thick BPSG glass layer. A first metallurgy level includes a set of closely spaced metal stripes, and a separate stripe widely spaced (from the set of closely spaced stripes) which leaves a large gap or depression therebetween resulting in a problem requiring the provision of dummy conductor lines between the closely spaced stripes and the widely spaced stripe.

The reason for the non-uniform spacing is that the interconnection system must join the devices in an operative circuit, and it is not possible to design such a circuit where all the conductor lines are uniformly spaced and parallel. Lee shows the deposition of a thin conformal dense layer deposited in a plasma enhanced environment followed by deposition of dielectric layer by spin-on-glass techniques which fill the gaps between closely spaced metal conductor lines. However, the wide gaps between conductor lines are not filled, because of the limitations of the prior art processing. The wide gaps cause a problem of poor planarity for the following lithography layer. Etching back the dielectric layer tends to increase the planarity of the top surface over closely spaced stripes, but does nothing to increase it in the wide gap. Even a subsequent step of deposition of a layer by PECVD techniques does not provide a planar surface over the wide gap. In practice, a second metallurgy layer would be deposited on the surface, after forming via holes to the metal stripes. It is believed apparent that as the metallurgy layers are built up, the surface planarity would deteriorate in the absence of a planarization step.

To solve the problems described above, the Lee patent teaches that formation of "dummy" conductor lines improves planarization under such circumstances.

The method of Lee uses dummy conductor lines to produce an improved integrated circuit semiconductor device provided with a multi-layer interconnection metallurgy system, having a planar global top surface with satisfactory planarization. The first step of the Lee process is to form a level of interconnection metallurgy on a semiconductor substrate having a plurality of close uniformly spaced conductor lines capable of carrying electric signals of a width, and wherein the level of metallurgy will also include conductor lines that are non-uniformly spaced, resulting in large areas between the conductor lines. Areas between the non-uniformly spaced conductor lines are filled with multiple and uniformly wide dummy conductor lines having a width of less than about one micrometer, where the spacing of the conductor lines is equal to or greater than three times the given width of the conductor lines. The dummy conductor lines include lines adjacent to conductive metal lines carrying signals, and other remaining conductor lines. The dummy conductor lines are connected adjacent to the conductor lines carrying signals to ground potential and the remaining dummy conductor lines are left floating. A non-conformal dielectric layer is deposited over the metallurgy level having a planar surface. The foregoing sequence of method steps are repeated until the multi-level metallurgy system is completed.

Alternatively, the method of Lee produces an integrated circuit semiconductor device provided with a multi-layer interconnection metallurgy system, having a planar global top surface. First, form a level of interconnection metallurgy on a semiconductor substrate having a plurality of close uniformly spaced conductor lines capable of carrying electric signals of a width, and wherein the level of metallurgy will also include conductor lines that are non-uniformly spaced, resulting in large spaced areas between the conductor lines. Fill in the areas between the non-uniformly spaced conductor lines with multiple and uniformly wide dummy conductor lines having a width of less than about one micrometer, where the spacing of the conductor lines is equal to or greater than three times the given width of the conductor lines, the dummy line including conductor lines adjacent conductor lines carrying signals, and other remaining conductor lines. Connect the dummy conductor lines adjacent to the conductor lines carrying signals to ground potential while leaving the remaining dummy conductor lines floating. Deposit a non-conformal dielectric layer over the metallurgy level having a planar surface. Repeat the foregoing sequence of method steps to form a second level of dummy conductor lines directly above the multiple and uniformly wide dummy conductor lines and connect the second level dummy conductor lines adjacent to second level conducting line carrying signals to ground potential and leaving the remaining dummy conductor lines floating to complete the metallurgy system.

FIG. 14 illustrates the prior art Lee process of designing a metallurgy pattern that includes dummy conductor lines in the mask used to fashion the metallurgy level.

In FIG. 14, block 30 describes the step of designing the necessary conductor lines of the metallurgy level for operative devices. The design takes into account the interaction with overlying metallurgy levels.

Block 32 relates to the step of using the design rule for the particular application, i.e. specifying the necessary width of the conductor lines and spacing of the conductor lines in the metallurgy level to suit the particular application. Normally the width of the line is approximately equal to the spacing of the conductor lines in areas where conductor lines are closely spaced. The "feature size" limits the minimum dimension of the line, since this is the smallest size feature that can be formed by the lithography techniques used to form the metallurgy. The feature size is defined by a number of factors, such as the wavelength of the light used to expose the pattern, the type of photoresist used in photolithography, etc. In this discussion, the metal stripe width is construed to be the "feature size".

Block 34 indicates pertains to coordinating the dummy metal line design with the design rule to determine where the dummy conductor lines are to be placed in the metallurgy level. The conductive line pattern is examined to locate large areas between conductor lines to be filled in with dummy conductor lines or areas. When the width "D" of the spaces between the conductor lines equals or exceeds three times the feature size, or the width of the conductive line, a dummy line or area is designed to fill the space. Obviously, the dummy conductor lines are spaced from the conductor lines.

Block 36 indicates the next step of examining the width of the dummy conductor lines. For example, if the width of the space between the conductor lines is equal to or greater than five times the width of the conductor lines, or alternatively if the width of the dummy line is equal to or greater than three times the width of the conductive line, then the wide dummy line is split in the sense that a plurality of narrower dummy conductor lines are substituted for a single wider dummy line. This step is indicated by block 38.

Finally, after the appropriate changes have been made, the mask is made, i.e. fabricated, as indicated by block 40.

Lee stated that it is preferable that the width "D" of the dummy conductor lines be restricted in width to less then one micrometer in order to present possible hillock growth which would potentially cause shorting between metallurgy levels. As the size of the line width becomes smaller, the possibility of hillock growth is reduced. It is also better to have uniformity of width of the plurality of dummy conductor lines, because this produces a more uniform etching or patterning of the conductive/dummy conductor lines.

Referring to FIGS. 15 and 16, a prior art P doped semiconductor substrate 10 includes an FET device having source/drain regions 12, and a gate electrode 14. The substrate 10 also has a field oxide layer 16, and a relatively thick borophosphosilicate glass (BPSG) layer 18. A first metallurgy level includes closely spaced metal (lines) stripes 20, and a distantly spaced (line) stripe 22. A dummy metal stripe 42 is provided between stripes 20 and 22 in FIG. 11. Alternatively, as shown in FIG. 14, a plurality of dummy stripes 44 are provided between (conductor lines) stripes 20 and 22 where the spacing is greater. The metallurgy level, including stripes 20, 22, and 42, is covered with a dielectric layer 50 with a top surface that is as planar as possible. The dummy line 42 eliminates the large depression, discussed above in connection with the Lee patent, cited above.

Referring to FIG. 15, a thin conformal dielectric layer 46 is formed over stripes 20, 22, and 42. Dielectric layer 46 is formed by plasma enhanced oxidation (PE—OX), with a thickness in the range of about 400 to 3000 Angstroms deposited by plasma enhanced chemical vacuum deposition. Layer 46 electrically isolates the metallurgy and levels the topography. Over layer 46 is formed a spin-on-glass dielectric 48 which fills in the gaps between the conductor lines and presents a relatively planar surface. Layer 48 may be a silicate or siloxane type material. The top surface of the dielectric layers 46 and 48 was etched back preferably after spin-on-glass curing to further enhance the surface planarity. A top dielectric layer 50 was deposited by plasma enhanced chemical vapor deposition (PECVD) techniques, such as TEOS or silane processing at about 370° to 400° C. Vias (not shown) were formed in the dielectric layers 46 and 48 and another metallurgy level and dielectric layer was formed, repeating the aforementioned steps.

Referring now to FIG. 16, there is shown a modification of FIG. 15 wherein there is a very wide space to be filled with dummy conductor lines. Here to reduce metal hillocks which occur where dummy conductor lines are very wide, the wide dummy conductor lines are broken up into many narrow dummy conductor lines 44. In the flow chart in FIG. 14, this refers to the functions described in blocks 36 and 38.

Referring now to FIG. 17, a prior art modification of FIG. 16 is shown where there is an additional metallurgy level. Each metallurgy level includes a plurality of dummy conductor lines and is covered with a dielectric layer. The dummy conductor lines 44 can be left floating, or can be grounded with line 60, depending on their location. When the dummy conductor lines 44 are adjacent to signal conductor lines, for example line 22, they should be grounded. In other locations, the grounding is not so critical.

The disadvantage of dummy conductor lines, in the current state of the art, is that usually there is a non-uniform layout pattern or too low a pattern density of interconnnection which causes a loading effect during etching or there is poor planarization resulting in backend features.

SUMMARY OF THE INVENTION

An object of this invention is to provide a generic method for computer generated dummy layout generation.

Other objects of this invention are as follows:

1. A simple way to generate the dummy pattern based on original circuit layout.
2. With the proper parameters assigned for the dummy layout, the minimum pattern size, spacing and overlap rule can be followed precisely.
3. Good pattern uniformity and proper pattern density are obtained by simple parameter tuning.
4. Cross talk between circuits in a device is reduced due to dummy pattern.

This invention provides the following features:

1. An algorithm provides for automatic computer generation of dummy layout patterns in a manner in which the parameters are adjustable.
2. A rule of thumb is provided for parameter selection which provides an acceptable layout for the most of the circuit.
3. Overlap prevention between dummy pattern and different layer circuit.

In accordance with this invention, a method is provided for producing a dummy pattern for an integrated circuit semiconductor device to be provided with a multi-layer interconnection metallurgy system, having a planar global top surface comprising providing a dummy pattern for a circuit starting with conductor lines in the circuit pattern A by the following steps. Provide a reverse pattern A-bar which is a complement of a widened conductor lines in the circuit pattern A with openings about the location of the circuit pattern A. Provide a dummy cross grid pattern G1. Provide a gridded dummy pattern G2 by creating a dummy grid pattern of the A-bar pattern by combining thereof with the negative of the dummy cross grid pattern G1 leaving a cross grid of dummy elements and openings about the location of the circuit pattern A. Then, provide a revised pattern A' by adding the circuit pattern A to the gridded dummy pattern.

Preferably, a sized and gridded dummy pattern G3 is provided by multiplying the gridded dummy pattern G2 times a function of the sizing operator of (−lambda) times a function of the sizing operator of (lambda).

The method is preferably performed by the following sequence of steps.

Provide a reverse pattern A-bar which is a complement of a first product of the circuit pattern A multiplied by a sizing operator; and to the first product is added a parameter of separation between the circuit pattern A and a circuit of the same layer as the circuit pattern A. Provide a dummy cross grid pattern GI. Provide a gridded dummy pattern G2 by subtracting the dummy cross grid pattern G1 from the reverse pattern A-bar. Provide a sized and gridded dummy pattern G3 by multiplying the gridded dummy pattern G2 times a function of the sizing operator of (−lambda) times a function of the sizing operator of (lambda). Then, provide a revised pattern A' by adding the circuit pattern A to the sized and gridded dummy pattern G3.

Preferably, the method provides computer automatic dummy layout generation which is adjustable parametrically.

It is preferred that the method is performed by the following sequence of steps. Provide a reverse pattern A-bar which is a complement of a first product of the circuit pattern A multiplied by a sizing operator; and to the first product is added a parameter of separation between the circuit pattern A and a circuit of the same layer as the circuit pattern A. Provide a dummy cross grid pattern G1. Provide a gridded dummy pattern G2 by subtracting the dummy cross grid pattern G1 from the reverse pattern A-bar. Provide a sized and separated contact layout pattern Co' by taking the product of a contact layout pattern Co multiplied times the sizing operator multiplied times a separation parameter. Provide a contact pattern adjusted, gridded dummy pattern G3' by subtracting the sized and separated contact layout pattern Co' from the gridded dummy pattern G2. Provide a sized, contact pattern adjusted, gridded dummy pattern G4 by multiplying the dummy pattern G3' times a function of the sizing operator of (−lambda) times a function of the sizing operator of (lambda), and provide a revised contact and circuit pattern A" by adding the circuit pattern A to the dummy pattern G4.

A system for producing a dummy pattern for an integrated circuit semiconductor device to be provided with a multi-layer interconnection metallurgy system, having a planar global top surface comprises a computer system including a terminal, a storage device, a memory, and a central processing unit, the program being stored in the storage device, and the program starting loading the circuit pattern A into the memory from the storage device. There are means for generating a reverse pattern A-bar which is a complement of a first product of the circuit pattern A multiplied by a sizing operator; and to the first product is added a parameter of separation between the circuit pattern A and a circuit of the same layer as the circuit pattern A; means for generating a dummy cross grid pattern G1; means for generating a gridded dummy pattern G2 by subtracting the dummy cross grid pattern G1 from the reverse pattern A-bar; means for generating a gridded dummy pattern G2 by subtracting the dummy cross grid pattern G1 from the reverse pattern A-bar, means for generating a sized and gridded dummy pattern G3 by multiplying the gridded dummy pattern G2 times a function of the sizing operator of (−lambda) times a function of the sizing operator of (lambda), and means for generating a revised pattern A' by adding the circuit pattern A to the sized and gridded dummy pattern G3.

Preferably the system provides computer automatic dummy layout generation which is adjustable parametrically.

It is further preferred that the system for producing a dummy pattern for an integrated circuit semiconductor device to be provided with a multi-layer interconnection metallurgy system, having a planar global top surface comprises a computer system including a terminal, a storage device, a memory, and a central processing unit, the program being stored in the storage device, and the program starting loading the circuit pattern A into the memory from the storage device; means for generating a reverse pattern A-bar which is a complement of a first product of the circuit pattern A multiplied by a sizing operator; and to the first product is added a parameter of separation between the circuit pattern A and a circuit of the same layer as the circuit pattern A; means for generating a dummy cross grid pattern G1; means for generating a gridded dummy pattern G2 by subtracting the dummy cross grid pattern G1 from the reverse pattern A-bar; means for generating a sized and separated contact layout pattern Co' by taking the product of a contact layout pattern Co multiplied times the sizing operator multiplied times a separation parameter; means for generating a contact pattern adjusted, gridded dummy pattern G3' by subtracting the sized and separated contact layout pattern Co' from the gridded dummy pattern G2, means for generating a sized, contact pattern adjusted, gridded dummy pattern G4 by multiplying the dummy pattern G3' times a function of the sizing operator of (−lambda) times a function of the sizing operator of (lambda), and means for generating a revised contact and circuit pattern A" by adding the circuit pattern A to the dummy pattern G4.

In accordance with still another aspect of this invention, a dummy pattern for an integrated circuit semiconductor device with a multi-layer interconnection metallurgy system, having a planar global top surface comprises a revised pattern A1 based on a circuit pattern A, comprising the sum of the circuit pattern A added to a sized and gridded dummy pattern G3 where G3 is the product of a gridded dummy pattern G2 times a function of the sizing operator of (−lambda) times a function of the sizing operator of (lambda), where the gridded dummy pattern G2 is the difference between a dummy cross grid pattern G1 and a reverse pattern A-bar, where A-bar is a complement of a first product of the circuit pattern A multiplied by a sizing operator; and wherein to the first product is added a parameter of separation between the circuit pattern A and a circuit of the same layer as the circuit pattern A.

Alternatively, a dummy pattern for an integrated circuit semiconductor device with a multi-layer interconnection metallurgy system, having a planar global top surface comprises a revised pattern A" based on a circuit pattern A, comprising the sum of the circuit pattern A added to a sized, contact pattern adjusted, gridded dummy pattern G4 where G4 is the product of a contact pattern adjusted, gridded dummy pattern G3' times a function of the sizing operator of (−lambda) times a function of the sizing operator of (lambda), where the pattern G3' is the difference between a gridded dummy pattern G2 and a sized and separated contact layout pattern Co', where the pattern G2 is the difference between a reverse pattern A-bar and a dummy cross grid pattern G1, and the reverse pattern A-bar is a complement of a first product of the circuit pattern A multiplied by a sizing operator; and wherein to the first product is added a parameter of separation between the circuit pattern A and a circuit of the same layer as the circuit pattern A.

BRIEF DESCRIPTION OF THE DRAWINGS

The foregoing and other aspects and advantages of this invention are explained and described below with reference to the accompanying drawings, in which:

FIG. 14 illustrates a prior art process of designing a metallurgy pattern that includes dummy conductor lines in the mask used to fashion the metallurgy level.

FIG. 15 shows sectional view of a prior art FET device formed on a P doped semiconductor substrate device with source/drain regions and a gate electrode with several dummy stripes provided between conductor lines.

FIG. 16 shows a modification of the device of FIG. 15 wherein there is a very wide space to be filled with dummy conductor lines.

FIG. 17 shows a prior art modification of the device of FIG. 16 where there is an additional metallurgy level.

DESCRIPTION OF THE PREFERRED EMBODIMENT

Figure 11:
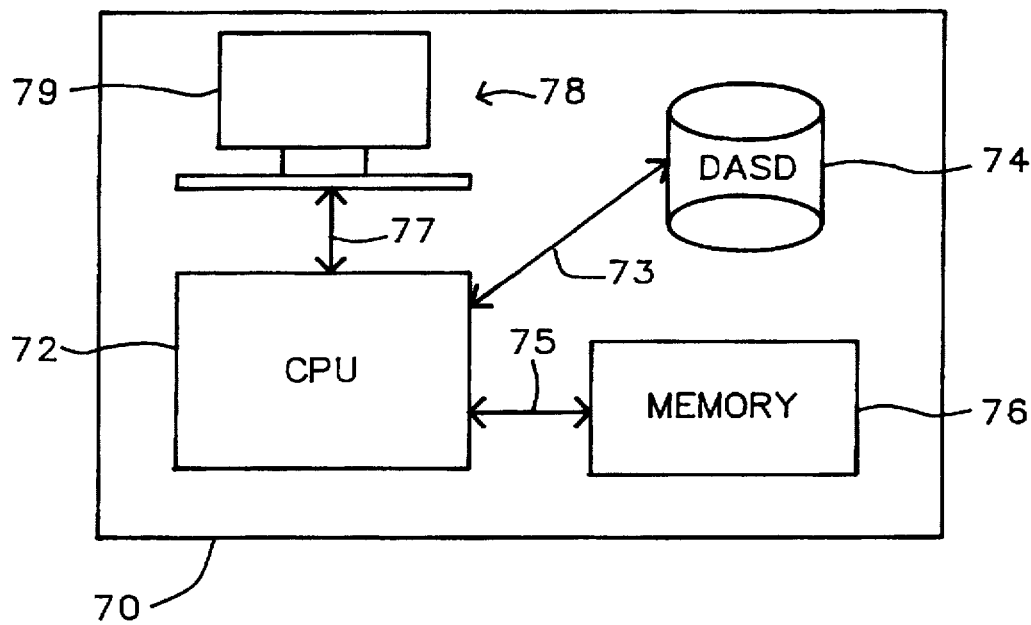
FIG. 11 shows a computer system employed in a Computer Assisted Design (CAD) system in accordance with the method and system of this invention.

In the method and system of this invention, a computer system 70 shown in FIG. 11 comprises a Computer Assisted Design (CAD) system. Computer 70 is provided with an a program or algorithm stored in a Direct Access Storage Device (DASD) 74 which provides automatic pattern generation techniques to provide a layout of dummy patterns to be added to a metallization or doped polysilicon conductor layer of an integrated circuit device such as an MOSFET device of the kind shown in FIGS. 15–17 to provide optimum planarization.

Method of Generating Dummy Pattern

The computer system 70 of FIG. 11 shows includes a Central Processing Unit (CPU) 72 connected by line 75 to memory 76. CPU 72 is also connected, by line 73, to the Direct Access Storage Device (DASD) 74. In addition, a terminal 78 is connected to CPU 72 by line 77. Terminal 78 includes a video monitor 79. The computer 70 includes a conventional system which contains the CAD algorithms in DASD 74 which are loaded from the DASD 74 into the memory 76 to be employed by CPU 72 to design patterns including the dummy layouts to be used to design integrated circuit devices, such as those shown in FIGS. 15–17, but with improved dummy layout patterns in accordance with this invention.

Method of A Layer Dummy Pattern Generation

Figure 1:
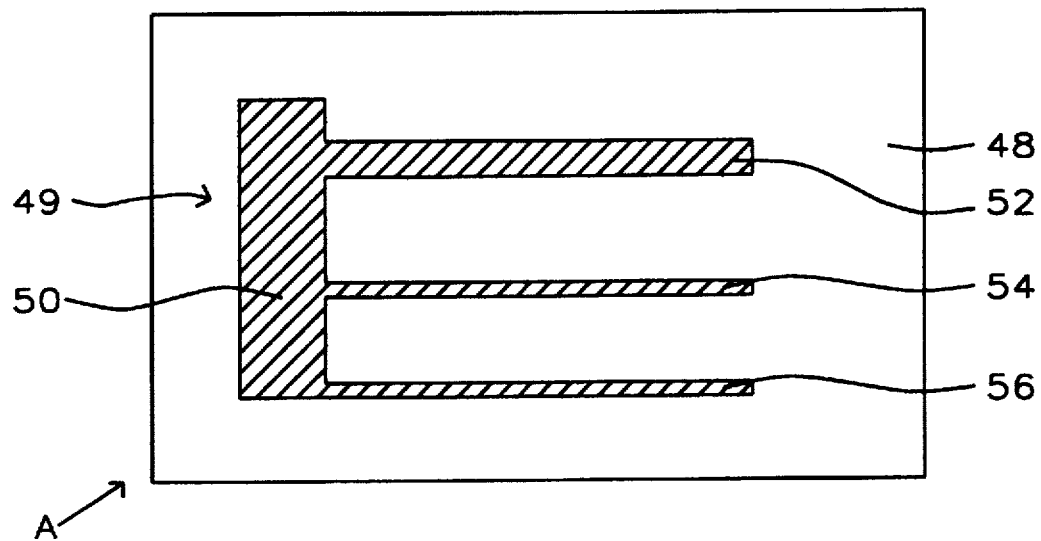
FIG. 1 is a plan view of a circuit pattern which has large spaces between conductor lines which require dummy pattern to be provided between and around the conductor lines.

FIG. 1 is a plan view of a circuit pattern "A" which has large spaces between conductor lines which require a dummy pattern of elements to be provided between and around the pattern 49 of conductor lines 50, 52, 54 and 56, where possible. The circuit pattern "A" is stored in the storage device DASD 74 of the computer 70 of FIG. 11.

The circuit pattern A includes the opaque conductor line pattern 49 formed on a transparent background 48. Pattern 49 comprises a single vertical body 50 with three horizontally extending, narrow conductor line legs 52, 54 and 56 attached to the vertical conductor body 50 with wide blank spaces around and between them which are to be filled, in part, with dummy elements of a dummy pattern, when appropriate, in accordance with this invention.

The pattern A of FIG. 1 represents an image of a pattern of an integrated circuit layout formed on an integrated circuit device stored in the DASD 74 which has been developed previously by a conventional CAD (Computer Assisted Design) program in the original data base of the CAD layout. The pattern A of FIG. 1 which was generated previously by the CAD program and stored in the DASD 74 is loaded into computer memory 76 of the computer 70 of FIG. 11 for further processing. The image of the pattern A held in memory 76 can be viewed on the monitor 79 of terminal 78 of the computer 70 in FIG. 11. Subsequent patterns shown in FIGS. 2–10 may also be viewed on the monitor 79 as the program progresses in the design of dummy patterns and incorporates those patterns into the design of the original circuit pattern A which is to be supplemented by the dummy patterns of this invention.

Figure 2:
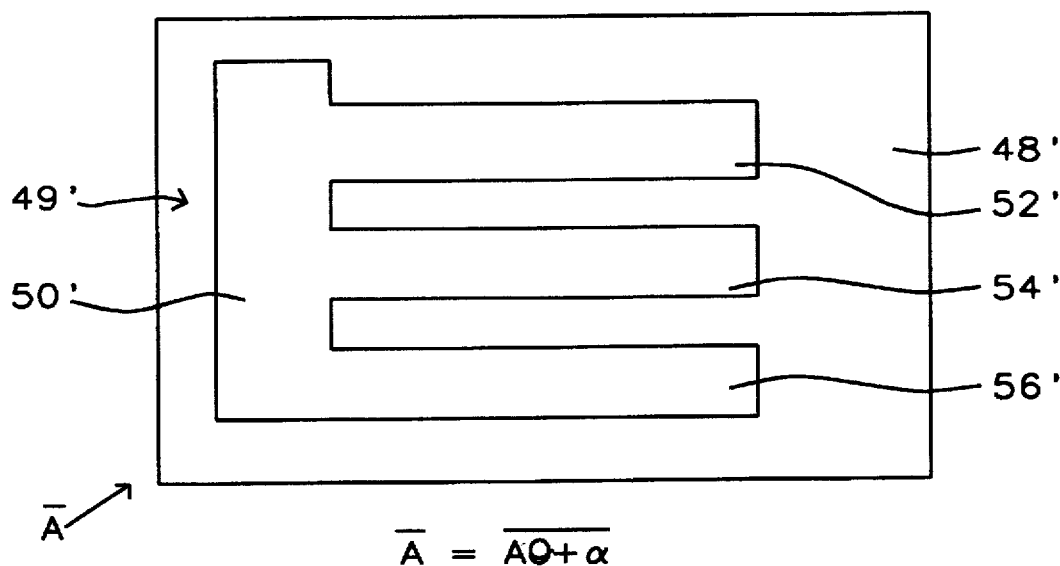
FIG. 2 illustrates a pattern which is a modified complementary image or "reverse" image of the image of FIG. 1.
Figure 12:
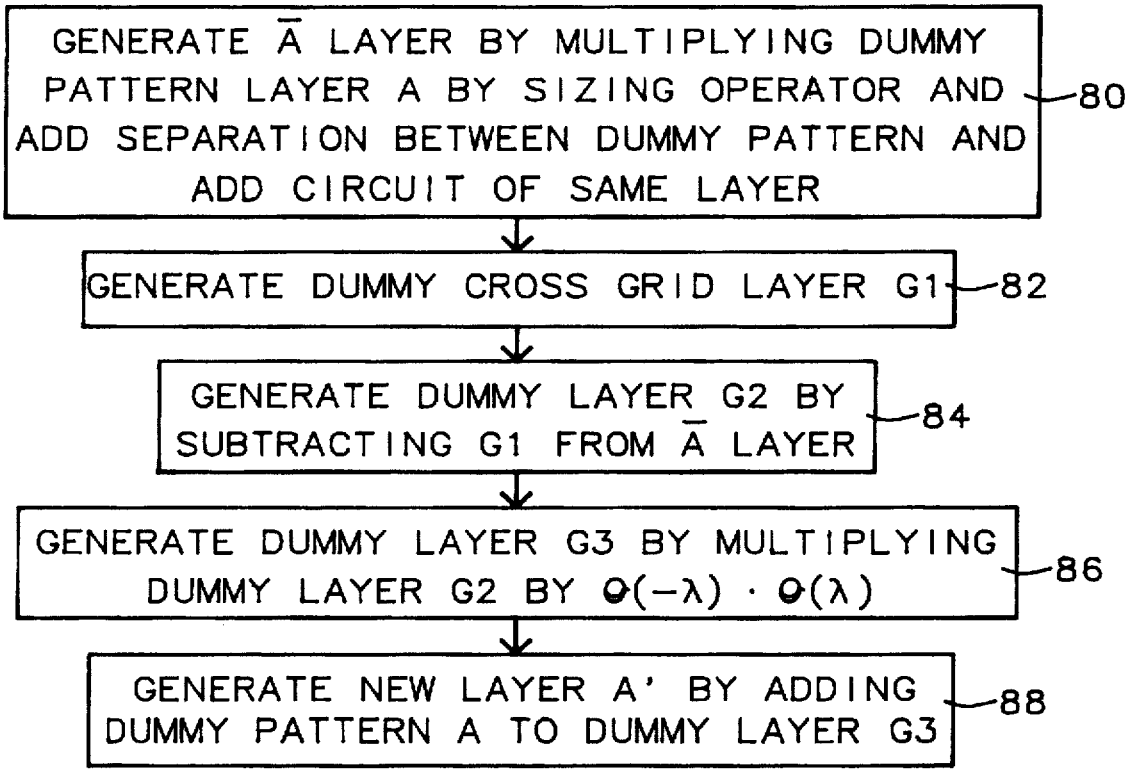
FIG. 12 is a flow chart illustrating a method in accordance with this invention, based on Appendix I.

FIG. 2 shows a window pattern 49' comprising a transparent window 50' in an opaque pattern 48' which is a modified complementary image or reverse (dummy) pattern A-bar of the image of FIG. 1 in accordance with the equation in step (1) in Appendix I below and block 80 in the flow chart of FIG. 12. FIG. 12 is a flow chart illustrating a method in accordance with this invention in accordance with Appendix I below. The reverse (dummy) pattern A-bar is used as a tool in preparing an initial dummy pattern in FIG. 3 in accordance with the flow chart of FIG. 12. The window pattern 49' includes a transparent window 50' in an opaque pattern 48'. Window pattern 49' is composed of a single vertical window 50' with three wider horizontally extending legs 52', 54' and 56' attached to vertical body 50'. The relationship between the pattern A of FIG. 1 and the reverse (dummy) pattern A-bar of FIG. 2 is determined by the equation in step (1) in Appendix I below where the pattern A is multiplied by the sizing operator and a value Alpha ($\alpha$) is added to that product of that multiplication step.

Alpha ($\alpha$) (which is defined to be the separation between the dummy pattern and a circuit of the same layer) has a value from about 5 µm to about 25 µm. In actuality, Alpha ($\alpha$) can be greater than or equal to the minimum space rule of the original layout which is dependent on circuit design and IC (Integrated Circuit) fabrication technology.

The sizing operator is defined in detail as an "adding" operation. A positive sizing operator value means sizing up the line dimension. A negative sizing operator value means sizing down the line dimension. The sizing operator is determined by the consideration of pattern density and the design rule of spacing in this pattern.

Figure 3:
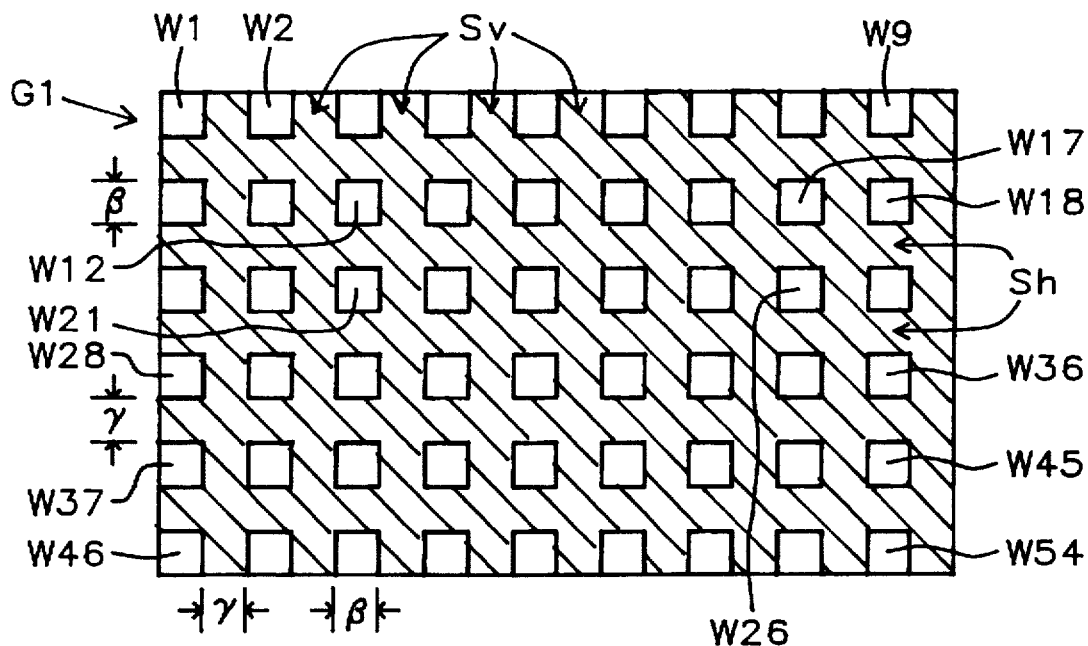
FIG. 3 shows a pattern of a dummy cross grid pattern to be employed in forming a pattern in accordance with this invention.

FIG. 3 shows a pattern G1 of a dummy cross grid pattern to be used in forming a dummy pattern in accordance with this invention in which the step (2) in Appendix I below and block 82 in the flow chart of FIG. 12, which comprises a grid of vertically and horizontally extending rows of opaque intersecting conductor lines with a width and a height of gamma separated by square transparent spaces SP in the grid. The spaces SP have a width and a height of Beta ($\beta$) between the horizontal stripes Sh and vertical stripes Sv.

Step 2 in Appendix I below defines the parameters which pertain to the pattern of FIG. 3. In particular, there are square "window" spaces measured by a quantity Beta ($\beta$) that is defined by the vertical and horizontal spaces between dummy pattern elements or stripes $S_v$ (vertical) and $S_h$ (horizontal). In step 2, Beta ($\beta$) is greater than or equal to a minimum "width" rule of the original layout finally. Thus the spaces W1, W2 ... W54 comprise a portion of an array of dummy square windows W1, W2 ... W54 which are generated with a feature size (width and height) Beta ($\beta$) on each side.

There is also a "width" measured by the quantity "Gamma", which is defined as the width of the horizontal and vertical stripes of the pattern elements Sv and Sh.

It is stated in step 2 that Gamma is greater than or equal to the minimum "space" rule. Finally, the array of square dummy windows W1, W2 ... W54 are generated with a spacing of Gamma between them in both the vertical and horizontal directions.

Different sets of Beta and Gamma can be used in different areas of a circuit layout to meet the different rule required between the core and the periphery of the circuit or to provide a different pattern density required in local areas.

Figure 4:
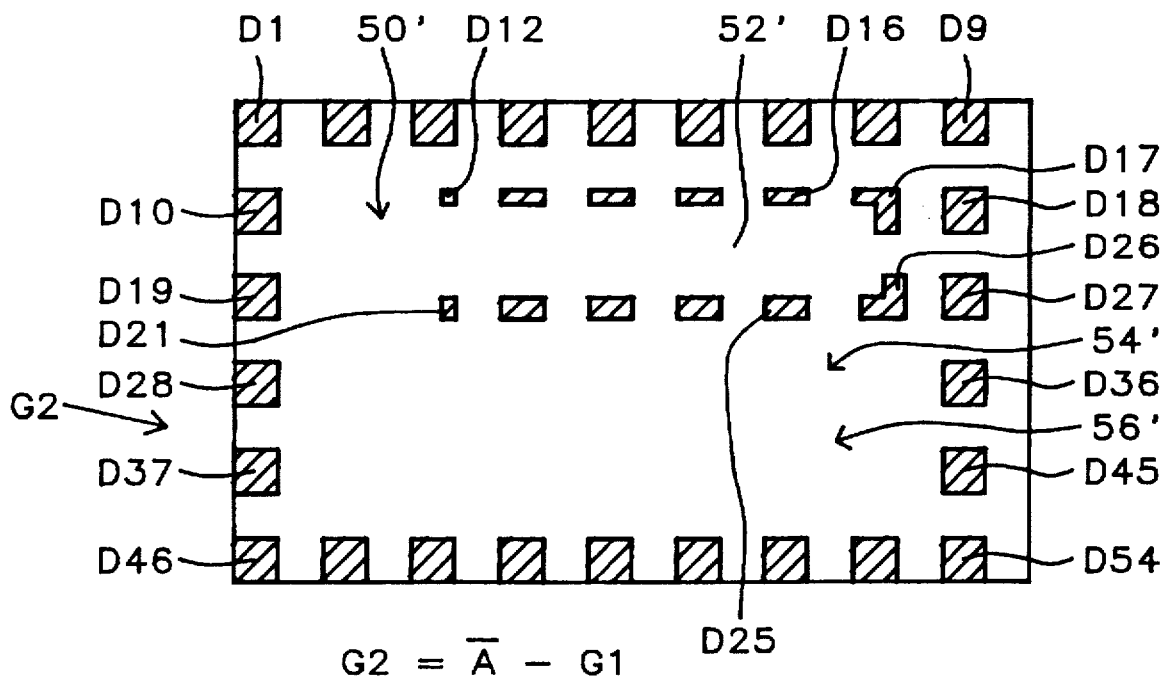
FIG. 4 shows an initial dummy pattern G2 derived by subtracting the patterns of FIG. 3 from the pattern of FIG. 2 in accordance with this invention.

FIG. 4 shows an initial dummy pattern G2 derived by subtracting the patterns of FIG. 3 from the pattern of FIG. 2 as defined by the equation in step (3) in Appendix I below and block 84 in the flow chart of FIG. 12, which comprises vertical and horizontal dots D1, D2, ... D54 of opaque material which are aligned and located as were transparent windows with W1, W2 ... W54 in FIG. 3. FIG. 4 shows the result of taking the pattern of FIG. 2 which is A-bar and subtracting the grid pattern G1 of FIG. 3 so that opaque areas in rows Sv and Sh of FIG. 3 are now transparent as are the legs 50', 52', 54' and 56' of FIG. 2.

In step 3 of Appendix I there is a mathematical equation defining the initial dummy pattern of FIG. 4. In the equation G2 is derived when G1 (FIG. 3) is subtracted from A-bar.

Looking at FIGS. 2 and 3, in more detail, in FIG. 3, the windows W1–W8 across the top, windows W10, W18, W28, W37 and W46, on the left margin, windows W18, W27, W36, W45 and W54 on the right margin, and the windows W46–W54 across the bottom are all superimposed on the dark portions of the pattern of FIG. 2 so the resultant dots D1–D8 across the top, windows D10, D18, D28, D37 and D46, on the left margin, windows D18, D27, D36, D45 and D54 on the right margin, and the windows D46–D54 across the bottom are all equal in dimensions to the windows since the reverse (dummy) pattern A-bar is opaque in those regions. However, where the window of FIG. 2 exists in regions 50', 52', 54' and 56' the dots are eliminated or reduced in size. The dots are smaller in the case of dots D12–D17, and dots D21–D26. There are no dots corresponding to windows W11, W20, W29–W35 in region 54' and W38–W44 in region 56'.

Figure 5:
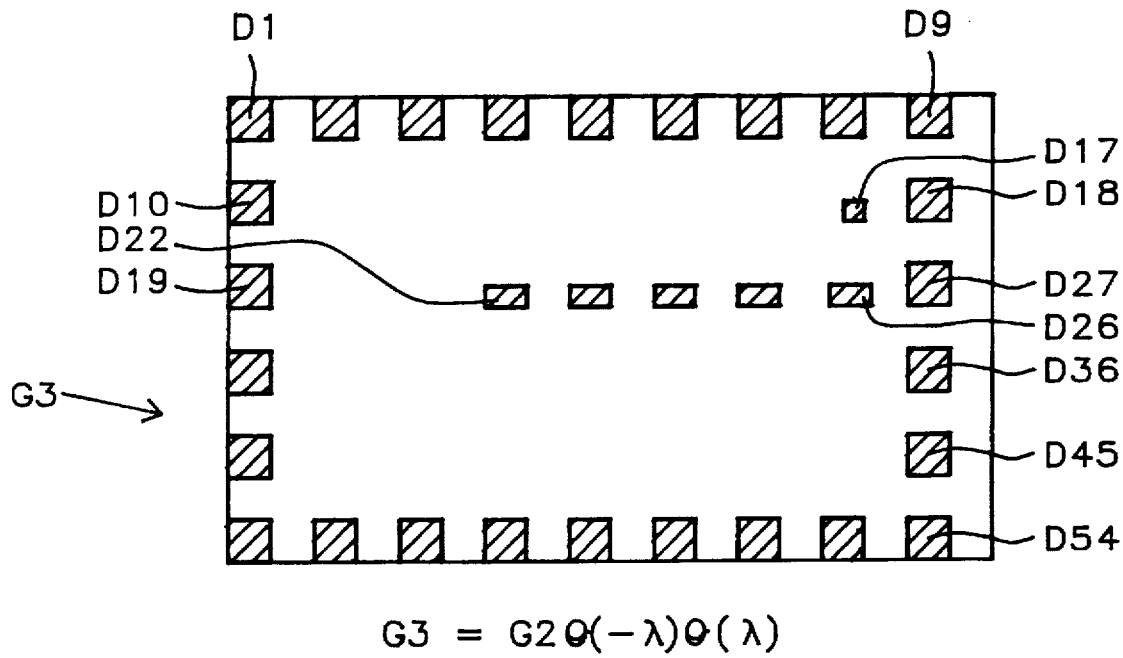
FIG. 5 shows a final dummy pattern which is the product of the pattern initial dummy pattern of FIG. 4 multiplied by a sizing operator of (minus Lambda) times a sizing operator of (Lambda), which removes smaller portions of the dummy pattern of FIG. 4.
Figure 8:
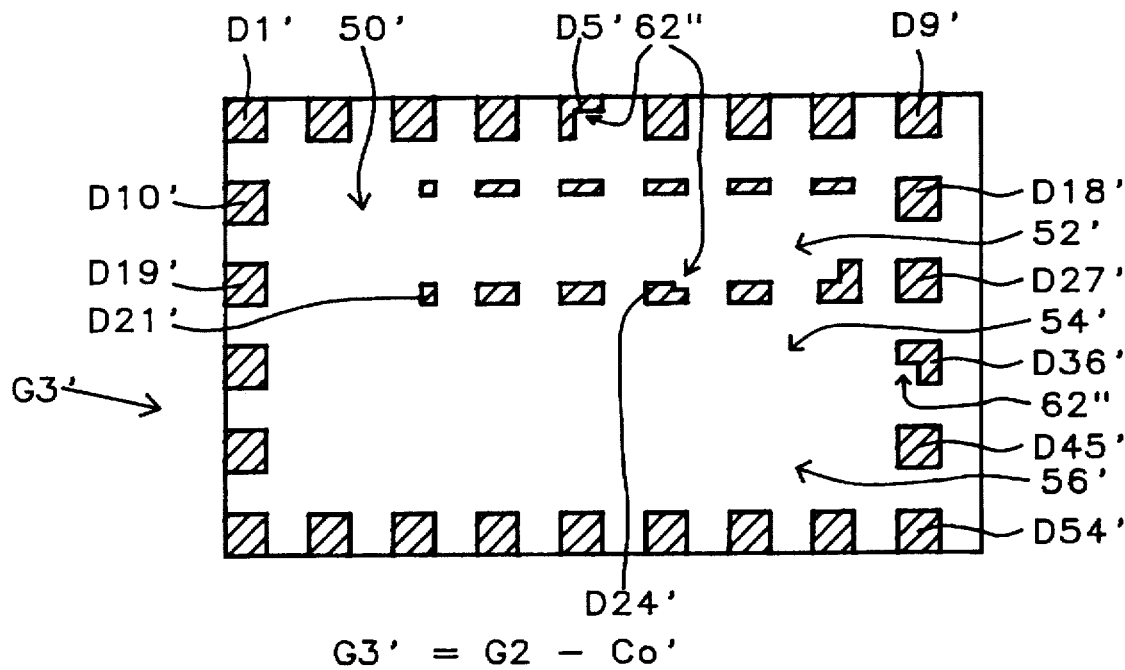
FIG. 8 shows the pattern of FIG. 4 which has been modified by subtracting the pattern of FIG. 7 therefrom.
Figure 9:
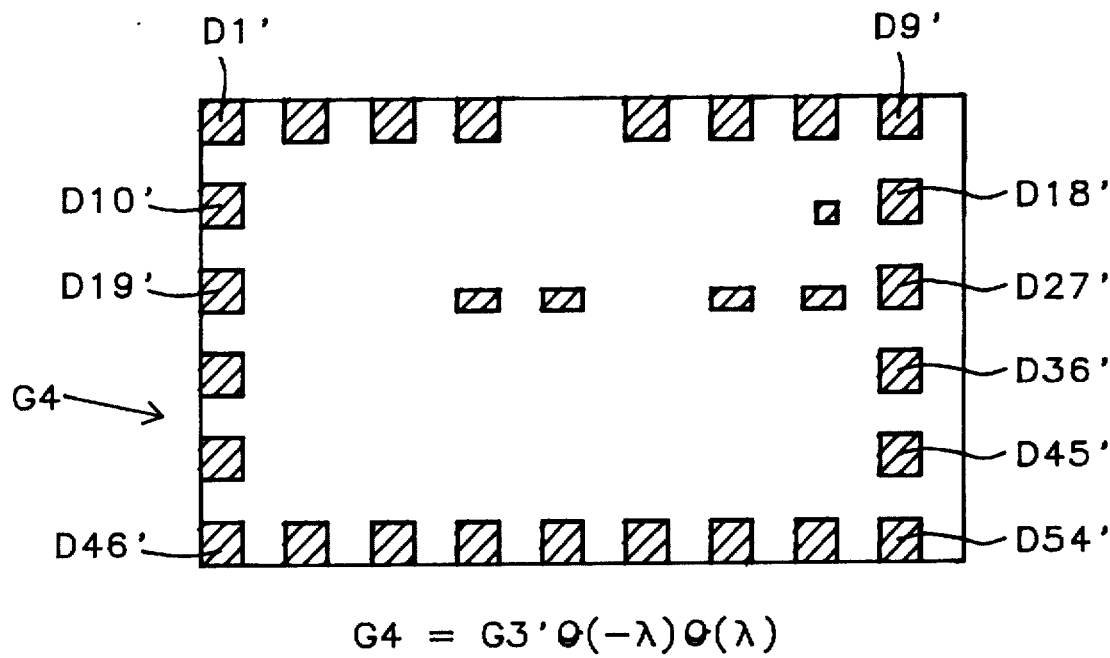
FIG. 9 is another final dummy pattern layout in FIG. 8 has been multiplied by a sizing operator of (minus Lambda) times a sizing operator of (Lambda), which removes smaller portions of the dummy pattern of FIG. 4.

Referring to FIGS. 5 and 9 and Appendix I, step 4 in Appendix I (which is block 86 in the flow chart of FIG. 9) follows next. FIG. 9 is another final dummy pattern layout in FIG. 8 has been multiplied by a sizing operator of (minus Lambda) times a sizing operator of (Lambda), which removes smaller portions of the dummy pattern of FIG. 4. The equation of step 4 is employed to generate the dummy pattern G3 as indicated by the equation in step 4 of table I and in block 86.

Using this operation, an irregular dummy pattern such as dot D17 and D26 generated in previous operations will be deleted if its line dimension is less than or equal to 2 Lambda. Thus in step 4 the dummy patterns D17 an D26 have a simpler square shape and meets the minimum width rule.

FIG. 5 shows the final dummy pattern G3 which is the product of the pattern G2 of FIG. 4 multiplied by the sizing operator of (minus Lambda) times the sizing operator of (Lambda) which removes smaller portions of the dummy pattern of FIG. 4. As can be seen, dots D12–D16, and D21 have been removed, whereas dots D17 and D26 have been modified to have rectangular shapes.

Figure 6:
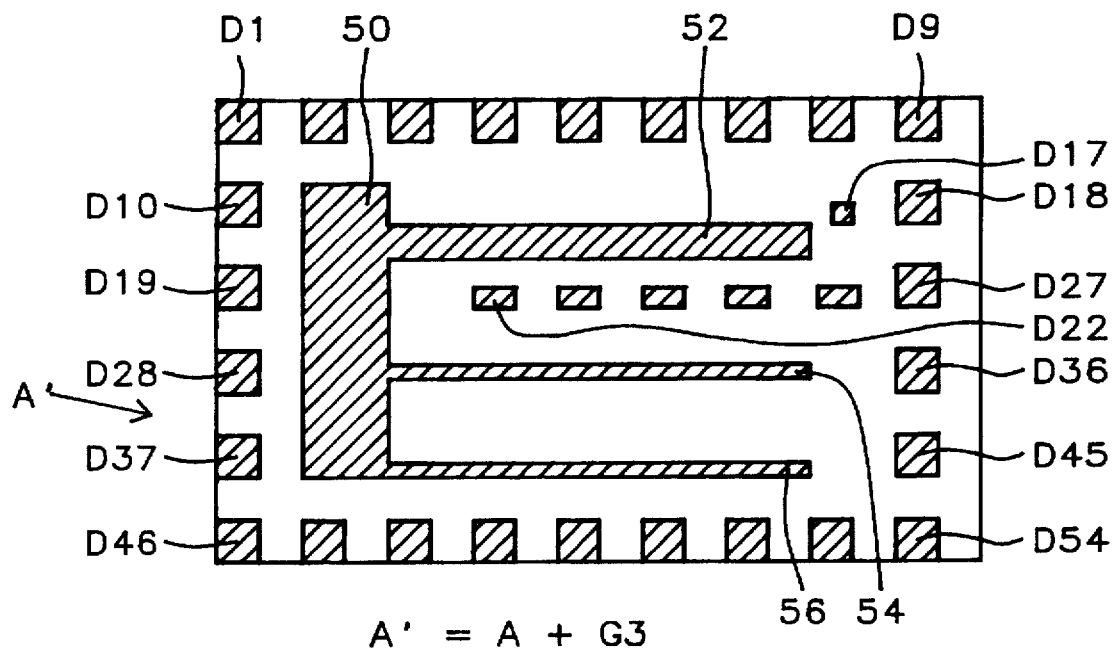
FIG. 6 shows a final device pattern which is the combination of the circuit pattern of FIG. 1 and the dummy pattern of FIG. 5 in accordance with this invention.

FIG. 6 shows the final circuit pattern A' which is the combination of the conductor pattern A of FIG. 1 and the final dummy pattern G3 of FIG. 5 which is defined by the equation in step 5 of Appendix I.

Block 88 in FIG. 12 describes the equation of step 5 in Appendix I to show how FIG. 6 is derived.

Method of Dummy Pattern Generation for Layer with Contact Blocked Concern

Referring to Appendix II, the steps 1–3 are identical to those described above with regard to Appendix I. Accordingly, the description is incorporated herein to that point for blocks 90, 92 and 94 of FIG. 13 which are identical to blocks 80, 82 and 84 of FIG. 12.

Figure 13:
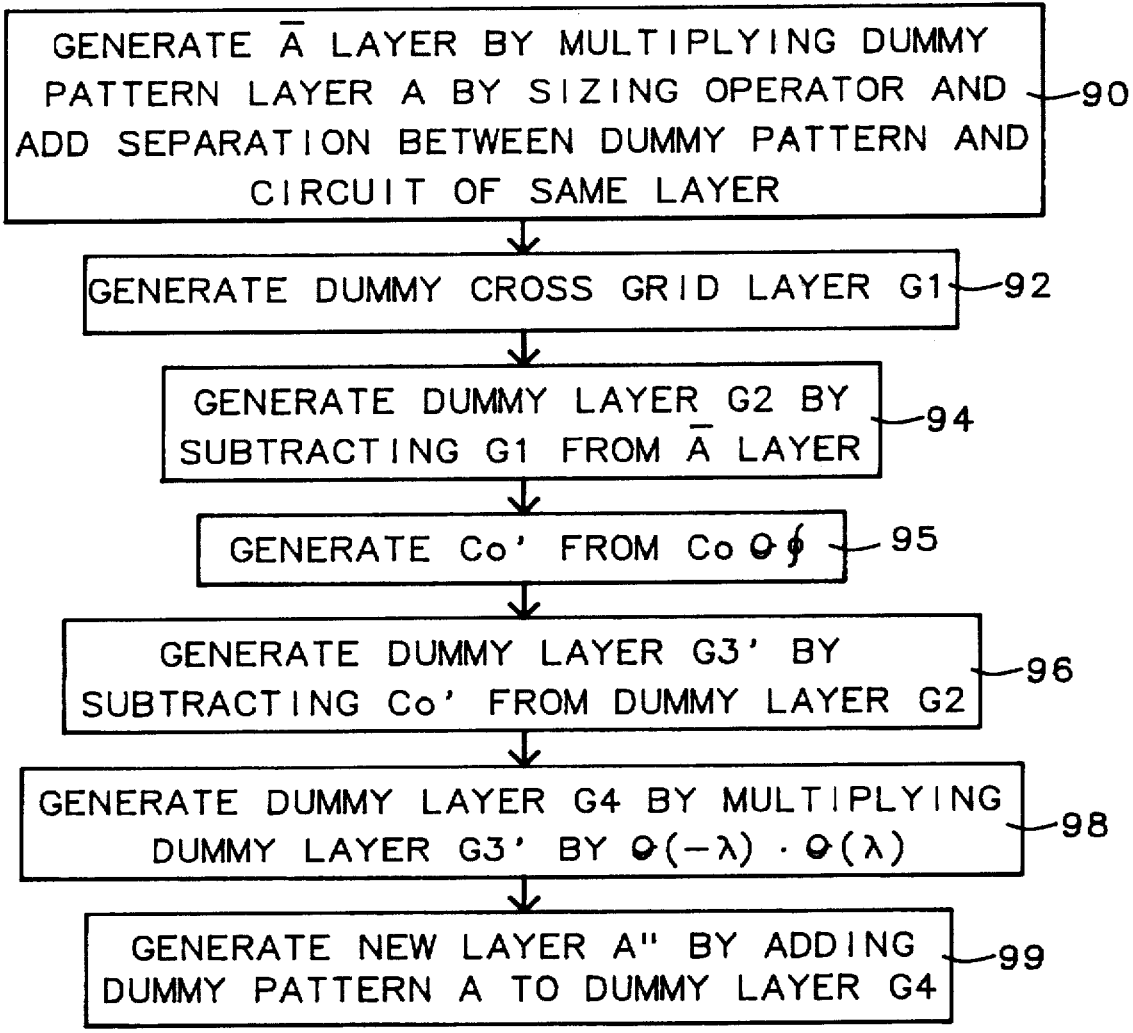
FIG. 13 shows a flow chart, which is a modification of the method of FIG. 12, of a method used for generating a polysilicon layer dummy pattern.

In step 4 in Appendix II, the value Co' is determined as the product of Co multiplied by the sizing operator and multiplied by the separation parameter, as indicated in block 95 in FIG. 13. The parameter Co is defined as the layout of the contact layer of the circuit. The phrase "min. co. space" is defined as the minimum spacing rule of contact to contact layout and that spacing algorithm is employed in accordance with this invention.

Figure 7:
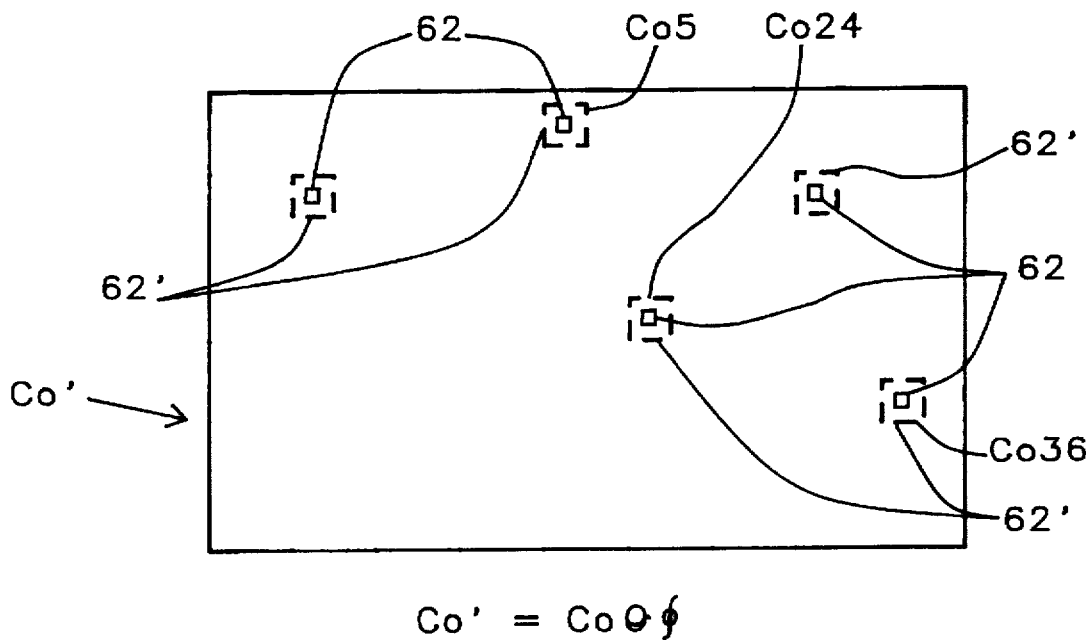
FIG. 7 shows a pattern of contact locations with the dark dots representing the digitized contact layout of the original pattern in which the system has done a sizing up operation so that the final digitized pattern is enlarged by the dashed rectangular pattern.

FIG. 7 shows a pattern of contact locations on the conductor pattern A of FIG. 1 with the dark dots 62 representing the digitized contact layout to be coordinated with the initial dummy pattern of FIG. 4. The system does a sizing up operation so that the final digitized pattern of dots 62 is enlarged by the dashed rectangular pattern 62'. certain dots 62 have been identified as Co5, Co24 and Co36 because they will interfere with dots D5', D24' and D36' as can be seen in FIG. 8, as will be explained in more detail below.

FIG. 8 shows a modified dummy pattern G3' which is formed by subtracting the contact pattern of FIG. 7 from the initial dummy pattern of FIG. 4 in accordance with step 5 in Appendix II, wherein the dummy pattern G3' as seen in FIG. 8 is generated as indicated in block 96 in FIG. 13. Thus dots D5', D24' and D36' have been trimmed away where they overlap the dashed rectangular patterns 62'. A different dummy pattern G3' is generated by performing the mathematical function shown in block 96 and step 4 of Appendix II where the separation between the dummy pattern and a circuit of a different layer is taken into account as indicated by the value G4 shown in FIG. 9.

In step 6, in Appendix II, the program generates the final dummy pattern G4 for use with the contact pattern, as seen in block 98 in FIG. 13. Note that there are no dots D11'–D17', D20', D22', D24', D29'–D35', and D38'–D44'. The process is the same as in step 86 in FIG. 12.

The equation in step 6 takes the modified dummy pattern G3' from FIG. 8 and step 5 and multiplies it by the sizing operator of (minus Lambda) times the sizing operator of (Lambda). Using this operation, the digitized pattern with the line dimension less than or equal to 2 Lambda will be deleted from the original layout, so that the program can keep the dummy pattern with simpler squares and a minimum width rule. Thus, the pattern G4 seen in FIG. 9 is the final dummy pattern layout which is desired to be inserted, in step 7, in accordance with this invention.

Figure 10:
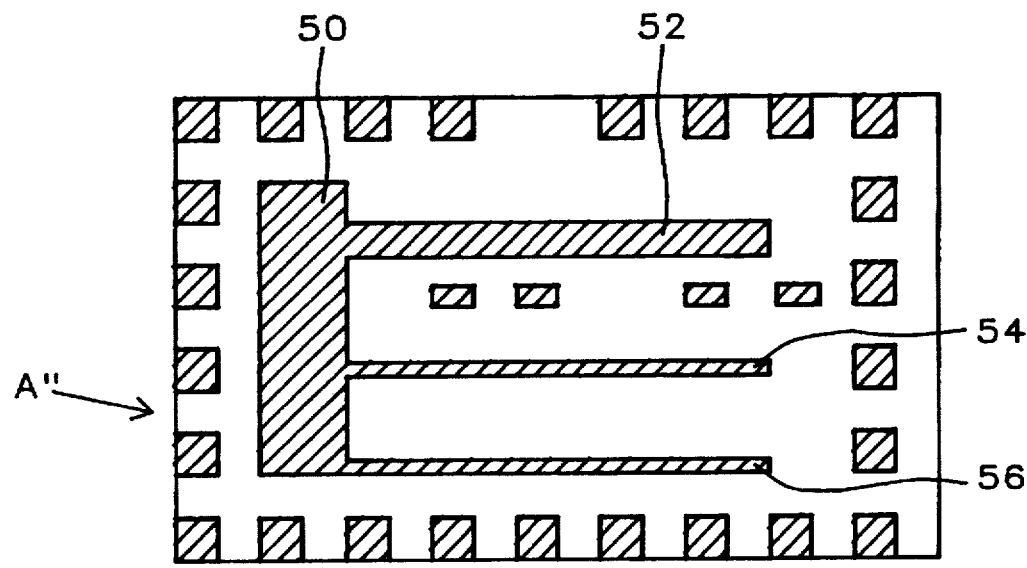
FIG. 10 shows another final device pattern which is the combination of the circuit pattern of FIG. 1 and the dummy pattern of FIG. 9 in accordance with this invention.

FIG. 10 shows another final device pattern which is the combination of the circuit pattern of FIG. 1 and the dummy pattern of FIG. 9 in accordance with this invention provided by step 7, in Appendix II. The program generates the new A" pattern of the circuit conductor 49 and the dummy pattern of FIG. 9, as seen in block 99 in FIG. 13.

Referring to FIG. 10, in step 7, we simply generate a new A" layout and the dummy pattern 49 of FIG. 1 is inserted into the pattern of G4 in FIG. 9.

The relationship between FIGS. 12 AND 13 is that the process of FIG. 12 can be used for all of the metallization layer and dummy pattern generation and only the width/space rule is considered in the same circuit layout.

FIG. 13 shows a flow chart of a method (which is a modification of FIG. 12) in accordance with this invention used for generating a polysilicon layer dummy pattern. Usually we need to take care not only of the polysilicon layer width/space rule, but also the overlap concern for the subsequent contact pattern formed.

APPENDIX I

Method of a Layer Dummy Pattern Generation (1) Generate dummy pattern $\overline{A}$ from circuit pattern A.

$\overline{A} = A\ O + \alpha\ (\alpha \geq \text{min. space rule})$ $\alpha$=Separation parameter between dummy pattern and another circuit of same layer.

O=Sizing operator (2) Generate dummy cross grid pattern G1.

G1, $\beta$=space; $\beta \geq$ min. width rule $\gamma$=width; $\gamma \geq$ min. space rule $\beta$=Space between dummy pattern elements in G1.

$\gamma$=Width of dummy pattern elements in G1.

$\lambda$=dummy of simplification (3) Generate gridded dummy pattern G2, where G2=$\overline{A}$–G1.

(4) Generate sized and gridded dummy pattern G3.

$$G3 = G2 O(-\lambda) O(\lambda) \left( \frac{\text{min. width rule}}{2} \leq \lambda < \frac{\beta}{2} \right)$$

(5) Generate revised circuit. pattern A', where A'=A+G3.

APPENDIX II

Dummy Pattern Generation for Layer with Contact Blocked Concern (1) Generate dummy pattern $\overline{A}$ from circuit pattern A.

$\overline{A} = \overline{A\ O} + \alpha$ ($\alpha \geq$ min. space rule)

$\alpha$=Separation parameter between dummy pattern and circuit of same layer.

O=Sizing operator.

(2) Generate dummy cross grid pattern G1.

$\beta$=space; $\beta \geq$ min. width rule $\gamma$=width; $\gamma \geq$ min. space rule $\beta$=Space between dummy pattern elements.

$\gamma$=Width of dummy pattern elements.

$\lambda$=dummy of simplification.

(3) Generate gridded dummy pattern G2, where G2=$\overline{A}$–G1.

(b 4) Generate sized & separated contact layout pattern Co'.

$Co' = CoO\phi \quad \phi \geq$ min. co. space

Co=Contact layout pattern.

$\phi$=Separation parameter: Separation between dummy pattern & circuit of different layer.

(5) Generate contact pattern adjusted, gridded dummy pattern G3', where G3'=G2–Co'.

(6) Generate sized, contact pattern adjusted, gridded dummy pattern G4, where G4=G3' O(–$\lambda$) O($\lambda$).

$$\left( \frac{\text{min. width rule}}{2} \leq \lambda < \frac{\beta}{2} \right)$$

(7) Generate revised and contact and circuit pattern A" from circuit pattern A and dummy pattern G4, where A"=A+G4.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of producing a dummy pattern for an integrated circuit semiconductor device to be provided with a multi-layer interconnection metallurgy system, having a planar global top surface comprising providing a dummy pattern for a circuit starting with conductor lines in said circuit pattern A by the steps as follows:

provatinga dummy pattern A-bar which is a complement of widened conductor lines in said circuit pattern A with openings about the location of said circuit pattern A, providing a dummy cross grid pattern G1 with a grid of vertically and horizontally extending rows of opaque intersecting lines separated by square transparent spaces, providing a gridded dummy pattern G2 by creating a dummy grid pattern of the A-bar pattern by combining thereof with the negative of the dummy cross grid pattern G1 leaving a cross grid of dummy elements and openings about the location of said circuit pattern A, providing a revised pattern A' by adding said circuit pattern A to said gridded dummy pattern, providing a sized and gridded dummy pattern G3 by multiplying said gridded dummy pattern G2 times a function of said sizing operator of (−lambda) times a function of said sizing operator of (lambda), thereby removing smaller portions of said dummy pattern, and providing a revised pattern A' by adding said circuit pattern A to said sized and gridded dummy pattern G3.

2. The method of claim 1 wherein said method includes:

providing a sized and gridded dummy pattern G3 by multiplying said gridded dummy pattern G2 times a function of said sizing operator of (−lambda) times a function of said sizing operator of (lambda) thereby removing smaller portions of said dummy pattern.

3. A method in accordance with claim 1 for performed by the sequence of steps as follows:

providing a reverse pattern A-bar which is a complement of a first product of said circuit pattern A multiplied by a sizing operator; and to said first product is added a parameter of separation between said circuit pattern A and a circuit of the same layer as said circuit pattern A, providing said dummy cross grid pattern G1 with said grid of vertically and horizontally extending rows of opaque intersecting lines separated by square transparent spaces, providing said gridded dummy pattern G2 by subtracting said dummy cross grid pattern G1 from said reverse pattern A-bar, providing a sized and gridded dummy pattern G3 by multiplying said gridded dummy pattern G2 times a function of said sizing operator of (−lambda) times a function of said sizing operator of (lambda), thereby removing smaller portions of said dummy pattern, and providing a revised pattern A' by adding said circuit pattern A to said sized and gridded dummy pattern G3.

4. The method of claim 3 wherein:

said method provides computer automatic dummy layout generation which is adjustable parametrically.

5. A method in accordance with claim 1 for performed by the sequence of steps as follows:

providing a reverse pattern A-bar which is a complement of a first product of said circuit pattern A multiplied by a sizing operator; and to said first product is added a parameter of separation between said circuit pattern A and a circuit of the same layer as said circuit pattern A, providing said dummy cross grid pattern G1, providing a gridded dummy pattern G2 by subtracting said dummy cross grid pattern G1 from said reverse pattern A-bar, providing a sized and separated contact layout pattern Co' by taking the product of a contact layout pattern Co multiplied times said sizing operator multiplied times a separation parameter, providing a contact pattern adjusted, gridded dummy pattern G3' by subtracting said sized and separated contact layout pattern Co' from said gridded dummy pattern G2, providing a sized, contact pattern adjusted, gridded dummy pattern G4 by multiplying said dummy pattern G3' times a function of said sizing operator of (−lambda) times a function of said sizing operator of (lambda), thereby removing smaller portions of said dummy pattern, and providing a revised contact and circuit pattern A" by adding said circuit pattern A to said dummy pattern G4.

6. The method of claim 5 wherein:

said method provides computer automatic dummy layout generation which is adjustable parametrically.

7. The method of claim 1 wherein said method includes:

providing a sized and gridded dummy pattern G3 by multiplying said gridded dummy pattern G2 times a function of said sizing operator of (−lambda) times a function of said sizing operator of (lambda), thereby removing smaller portions of said dummy pattern.

8. A system for producing a dummy pattern for an integrated circuit semiconductor device to be provided with a multi-layer interconnection metallurgy system, having a planar global top surface comprising:

a computer system including a terminal, a storage device, a memory, and a central processing unit, said program being stored in said storage device, and said program starting loading said circuit pattern A into said memory from said storage device, means for generating a reverse pattern A-bar which is a complement of a first product of said circuit pattern A multiplied by a sizing operator; and to said first product is added a parameter of separation between said circuit pattern A and a circuit of the same layer as said circuit pattern A, means for generating a dummy cross grid pattern G1 with a grid of vertically and horizontally extending rows of opaque intersecting lines separated by square transparent spaces, means for generating a gridded dummy pattern G2 by subtracting said dummy cross grid pattern G1 from said reverse pattern A-bar, means for generating a sized and gridded dummy pattern G3 by multiplying said gridded dummy pattern G2 times a function of said sizing operator of (−lambda) times a function of said sizing operator of (lambda), thereby removing smaller portions of said dummy pattern, and means for generating a revised pattern A' by adding said circuit pattern A to said sized and gridded dummy pattern G3.

9. The system of claim 8 wherein:

said system provides computer automatic dummy layout generation which is adjustable parametrically.

10. A system for producing a dummy pattern for an integrated circuit semiconductor device to be provided with a multi-layer interconnection metallurgy system, having a planar global top surface comprising:

a computer system including a terminal, a storage device, a memory, and a central processing unit, said program being stored in said storage device, and said program starting loading said circuit pattern A into said memory from said storage device, means for generating a reverse pattern A-bar which is a complement of a first product of said circuit pattern A multiplied by a sizing operator; and to said first product is added a parameter of separation between said circuit pattern A and a circuit of the same layer as said circuit pattern A, means for generating said dummy cross grid pattern G1 with said grid of vertically and horizontally extending rows of opaque intersecting lines separated by square transparent spaces, means for generating a gridded dummy pattern G2 by subtracting said dummy cross grid pattern G1 from said reverse pattern A-bar, means for generating a sized and separated contact layout pattern Co' by taking the product of a contact layout pattern Co multiplied times said sizing operator multiplied times a separation parameter, means for generating a contact pattern adjusted, gridded dummy pattern G3' by subtracting said sized and separated contact layout pattern Co' from said gridded dummy pattern G2, means for generating a sized, contact pattern adjusted, gridded dummy pattern G4 by multiplying said dummy pattern G3' times a function of said sizing operator of (−lambda) times a function of said sizing operator of (lambda), and means for generating a revised contact and circuit pattern A" by adding said circuit pattern A to said dummy pattern G4.

11. The system of claim 10 wherein:
said system provides computer automatic dummy layout generation which is adjustable parametrically.

12. The method of claim 10 wherein said method includes:
providing a sized and gridded dummy pattern G3 by multiplying said gridded dummy pattern G2 times a function of said sizing operator of (−lambda) times a function of said sizing operator of (lambda), thereby removing smaller portions of said dummy pattern.

13. A dummy pattern for an integrated circuit semiconductor device with a multi-layer interconnection metallurgy system, having a planar global top surface comprising:
a revised pattern A' based on a circuit pattern A comprising the sum of said circuit pattern A added to a gridded dummy pattern G2 comprising the difference between a dummy cross grid pattern G1 with a grid of vertically and horizontally extending rows of opaque intersecting lines separated by square transparent spaces and a reverse pattern A-bar, where A-bar is a complement of a first product of said circuit pattern A; and wherein to said first product is added a parameter of separation between said circuit pattern A and a circuit of the same layer as said circuit pattern A, providing a sized and gridded dummy pattern G3 by multiplying said gridded dummy pattern G2 times a function of said sizing operator of (−lambda) times a function of said sizing operator of (lambda), thereby removing smaller portions of said dummy pattern, and providing a revised pattern A' by adding said circuit pattern A to said sized and gridded dummy pattern G3.

14. The method of claim 13 wherein said method includes:
providing a sized and gridded dummy pattern G3 by multiplying said gridded dummy pattern G2 times a function of said sizing operator of (−lambda) times a function of said sizing operator of (lambda), thereby removing smaller portions of said dummy pattern.

15. A dummy pattern for an integrated circuit semiconductor device with a multi-layer interconnection metallurgy system, having a planar global top surface comprising:
a revised pattern A' based on a circuit pattern A, comprising the sum of said circuit pattern A added to a sized and gridded dummy pattern G3 where G3 is the product of a gridded dummy pattern G2 times a function of said sizing operator of (−lambda) times a function of said sizing operator of (lambda), thereby removing smaller portions of said dummy pattern where said gridded dummy pattern G2 is as follows:
the difference between a dummy cross grid pattern G1, comprising a grid of vertically and horizontally extending rows of opaque intersecting lines separated by square transparent spaces, and a reverse pattern A-bar,
where A-bar is a complement of a first product of said circuit pattern A multiplied by a sizing operator; and
wherein to said first product is added a parameter of separation between said circuit pattern A and a circuit of the same layer as said circuit pattern A.

16. A dummy pattern for an integrated circuit semiconductor device with a multi-layer interconnection metallurgy system, having a planar global top surface comprising:
a revised pattern based on a circuit pattern A comprising the sum of said circuit pattern A added to a contact pattern adjusted, gridded dummy pattern comprising the product of a contact pattern adjusted, gridded dummy pattern comprising the difference between a gridded dummy pattern and a sized and separated contact layout pattern Co', where said gridded dummy pattern Is the difference between a pattern A-bar and a dummy cross grid pattern GI, comprising a grid of vertically and horizontally extending rows of opaque intersecting lines separated by square transparent spaces, and said reverse pattern A-bar is a complement of a first product of said circuit pattern A multiplied by a sizing operator;

providing a sized and gridded dummy pattern G3 by multiplying said gridded dummy pattern G2 times a function of said sizing operator of (−lambda) times a function of said sizing operator of (lambda), thereby removing smaller portions of said dummy pattern, and providing a revised pattern A' by adding said circuit pattern A to said sized and gridded dummy pattern G3, wherein to said first product is added a parameter of separation between said circuit pattern A and a circuit of the same layer as said circuit pattern A.

17. The method of claim 16 wherein said method includes:
providing a sized and gridded dummy pattern G3 by multiplying said gridded dummy pattern G2 times a function of said sizing operator of (−lambda) times a function of said sizing operator of (lambda), thereby removing smaller portions of said dummy pattern.

18. A dummy pattern for an integrated circuit semiconductor device with a multi-layer interconnection metallurgy system, having a planar global top surface comprising:

a revised pattern A" based on a circuit pattern A, comprising the sum of said circuit pattern A added to a sized, contact pattern adjusted, gridded dummy pattern G4 where G4 is the product of a contact pattern adjusted, gridded dummy pattern G3' times a function of said sizing operator of (−lambda) times a function of said sizing operator of (lambda), where said pattern G3' is the difference between a gridded dummy pattern G2 and a sized and separated contact layout pattern Co', where said pattern G2 is as follows:

the difference between a reverse pattern A-bar and a dummy cross grid pattern G1 comprising a grid of vertically and horizontally extending rows of opaque intersecting lines separated by square transparent spaces, and said reverse pattern A-bar is a complement of a first product of said circuit pattern A multiplied by a sizing operator; and wherein to said first product is added a parameter of separation between said circuit pattern A and a circuit of the same layer as said circuit pattern A.

19. The method of claim 18 wherein said method includes:

providing a sized and gridded dummy pattern G3 by multiplying said gridded dummy pattern G2 times a function of said sizing operator of (−lambda) times a function of said sizing operator of (lambda), thereby removing smaller portions of said dummy pattern.

* * * * *